United States Patent
Barik et al.

(10) Patent No.: US 12,550,643 B2
(45) Date of Patent: Feb. 10, 2026

(54) OXIDANTS AND STRAINED-RING PRECURSORS

(71) Applicants: Applied Materials, Inc., Santa Clara, CA (US); National University of Singapore, Singapore (SG)

(72) Inventors: Chandan Kr Barik, Singapore (SG); Doreen Wei Ying Yong, Singapore (SG); John Sudijono, Singapore (SG); Cong Trinh, Santa Clara, CA (US); Bhaskar Jyoti Bhuyan, San Jose, CA (US); Michael Haverty, Mountain View, CA (US); Muthukumar Kaliappan, Fremont, CA (US); Yingqian Chen, Singapore (SG); Anil Kumar Tummanapelli, Singapore (SG); Richard Ming Wah Wong, Singapore (SG)

(73) Assignees: Applied Materials, Inc., Santa Clara, CA (US); National University of Singapore, Singapore (SG)

( * ) Notice: Subject to any disclaimer, the term of this patent is extended or adjusted under 35 U.S.C. 154(b) by 1133 days.

(21) Appl. No.: 17/355,154

(22) Filed: Jun. 22, 2021

(65) Prior Publication Data

US 2022/0406595 A1 Dec. 22, 2022

(51) Int. Cl.
*H01L 21/02* (2006.01)
*C23C 16/34* (2006.01)
(Continued)

(52) U.S. Cl.
CPC ...... *H01L 21/02208* (2013.01); *C23C 16/345* (2013.01); *C23C 16/401* (2013.01);
(Continued)

(58) Field of Classification Search
CPC ......... H01L 21/02208; H01L 21/02164; H01L 21/0217; H01L 21/0228; H01L 21/0234;
(Continued)

(56) References Cited

U.S. PATENT DOCUMENTS 2,590,039 A * 3/1952 Richter ................ C08G 77/60
508/203
3,501,515 A * 3/1970 Van Winkle .......... B01J 31/248
568/429
(Continued)

FOREIGN PATENT DOCUMENTS

JP H03115573 A 5/1991
JP 2015525773 A 9/2015
(Continued)

OTHER PUBLICATIONS

PCT International Search Report and Written Opinion in PCT/US2022/034513 dated Dec. 2, 2022, 13 pages.
(Continued)

*Primary Examiner* — Kevin R Kruer
(74) *Attorney, Agent, or Firm* — SERVILLA WHITNEY LLC

(57) ABSTRACT

Novel cyclic silicon precursors and oxidants are described. Methods for depositing silicon-containing films on a substrate are described. The substrate is exposed to a silicon precursor and a reactant to form the silicon-containing film (e.g., elemental silicon, silicon oxide, silicon nitride). The exposures can be sequential or simultaneous.

19 Claims, 4 Drawing Sheets

US 12,550,643 B2

Page 2

(51) Int. Cl.
    *C23C 16/40*     (2006.01)
    *C23C 16/455*     (2006.01)

(52) U.S. Cl.
    CPC .. C23C 16/45553 (2013.01); H01L 21/02164 (2013.01); H01L 21/0217 (2013.01); H01L 21/0228 (2013.01)

(58) Field of Classification Search
    CPC ................ C23C 16/345; C23C 16/401; C23C 16/45553
    See application file for complete search history.

(56) References Cited

U.S. PATENT DOCUMENTS

| | | | |
|---|---|---|---|
| 5,011,706 A | | 4/1991 | Tarhay et al. |
| 6,211,393 B1* | | 4/2001 | Seguin ................. C07F 7/1896 556/419 |
| 8,530,361 B2* | | 9/2013 | Xiao ...................... C23C 16/402 438/794 |
| 9,371,338 B2* | | 6/2016 | Dussarrat ................. B05D 1/60 |
| 9,382,268 B1* | | 7/2016 | Kuchenbeiser ......... C07F 7/025 |
| 10,381,219 B1* | | 8/2019 | Ueda ................. H01L 21/02274 |
| 10,453,675 B2* | | 10/2019 | O'Neill ............... H01L 21/0214 |
| 2003/0027433 A1* | | 2/2003 | Faur .................. H01L 21/31675 438/770 |
| 2003/0099844 A1* | | 5/2003 | Hanahata .......... H01L 21/02337 257/E21.271 |
| 2003/0186494 A1* | | 10/2003 | Rantala ................. H01L 21/316 438/200 |
| 2005/0163927 A1* | | 7/2005 | McSwiney .............. C07F 7/025 427/248.1 |
| 2007/0275166 A1* | | 11/2007 | Thridandam ..... H01L 21/02219 427/248.1 |
| 2012/0108718 A1* | | 5/2012 | Yukimura ............. C07F 7/1804 556/407 |
| 2014/0134416 A1* | | 5/2014 | Burdinski ............... C08L 83/08 521/154 |
| 2014/0235882 A1* | | 8/2014 | Platteeuw ............. C07J 1/0059 552/625 |
| 2015/0004317 A1 | | 1/2015 | Dussarrat et al. |
| 2015/0087139 A1* | | 3/2015 | O'Neill ............. C23C 16/45553 438/789 |
| 2015/0162191 A1* | | 6/2015 | Saly .................... H01L 21/0217 556/407 |
| 2016/0122296 A1* | | 5/2016 | Parvulescu ........... C07C 315/02 568/34 |
| 2017/0298510 A1* | | 10/2017 | Husson ................. C23C 16/402 |
| 2017/0341336 A1* | | 11/2017 | Haruta .................... B32B 27/06 |
| 2018/0023192 A1* | | 1/2018 | Chandra ............... C23C 16/345 438/760 |
| 2018/0025906 A1* | | 1/2018 | Quick ............... H01L 21/76831 438/794 |
| 2018/0102260 A1* | | 4/2018 | Hwang ................. H10B 12/482 |
| 2018/0210115 A1* | | 7/2018 | Chen ........................ C09D 7/20 |
| 2018/0212184 A1* | | 7/2018 | Kondo ................... H10K 50/81 |
| 2018/0215124 A1* | | 8/2018 | Hattori .................... G02B 1/111 |
| 2018/0223061 A1* | | 8/2018 | Hattori ...................... C08J 3/24 |
| 2018/0342390 A1* | | 11/2018 | Xiao ................. C23C 16/45553 |
| 2018/0355483 A1* | | 12/2018 | Kuchenbeiser .......... C09D 4/00 |
| 2019/0040223 A1* | | 2/2019 | Ryu .......................... C08J 9/28 |
| 2019/0085451 A1* | | 3/2019 | Lei ...................... H01L 21/0217 |
| 2019/0292658 A1* | | 9/2019 | Li ............................ C23C 16/36 |
| 2019/0333770 A1* | | 10/2019 | Lian .................... H10D 62/151 |
| 2020/0048286 A1* | | 2/2020 | Xiao ..................... C23C 16/487 |
| 2020/0075312 A1* | | 3/2020 | Chandra ............. H01L 21/0217 |
| 2020/0116921 A1* | | 4/2020 | Hattori ................. G02B 6/0055 |
| 2020/0166694 A1* | | 5/2020 | Sugino .................... G02B 5/00 |
| 2020/0270749 A1* | | 8/2020 | Li ....................... H01L 21/02211 |
| 2020/0354510 A1* | | 11/2020 | Lu ........................... H01B 3/307 |
| 2020/0377534 A1* | | 12/2020 | Tang .................... C07F 9/5442 |
| 2021/0050212 A1 | | 2/2021 | Durand et al. |
| 2021/0140040 A1* | | 5/2021 | Li .......................... C07F 7/1804 |
| 2022/0057562 A1* | | 2/2022 | Morishima .......... G02B 6/0061 |
| 2022/0178028 A1* | | 6/2022 | Xinjian ................. C01B 33/126 |
| 2022/0380390 A1* | | 12/2022 | Kim ..................... H10N 70/826 |
| 2022/0406595 A1* | | 12/2022 | Barik .................. H01L 21/0234 |
| 2023/0123377 A1* | | 4/2023 | Xiao ...................... C23C 16/30 427/248.1 |
| 2024/0162036 A1* | | 5/2024 | Madhiwala ....... H01L 21/02312 |
| 2025/0201548 A1* | | 6/2025 | Chua ................... H01L 21/0214 |

FOREIGN PATENT DOCUMENTS

| | | |
|---|---|---|
| JP | 2017507908 A | 3/2017 |
| JP | 2018098304 A | 6/2018 |
| JP | 2018154615 A | 10/2018 |
| JP | 2019186550 A | 10/2019 |
| TW | 201900660 A | 1/2019 |
| WO | 2017023693 A1 | 2/2017 |

OTHER PUBLICATIONS

Wrobel, A. M., et al., "Mechanism of the Activation of 1,1,3,3-Tetramethyl-1,3-disilacyclobutane in Plasma Chemical Vapor Deposition", Chem. Mater., 1994, vol. 6, No. 10, pp. 1766-1770 abstract; pp. 1766-1767, experimental section; table 1; figure 1.

Ustynyuk, et al., "Heteroorganic betaines. 6. Structure and reactivity of silicon-containing organophosphorus betaines with the -S—Si—C—P+ fragment: a DFT study", Russian Chemical Bulletin 50, 771-779 (May 2001).

\* cited by examiner

OXIDANTS AND STRAINED-RING PRECURSORS

TECHNICAL FIELD

Embodiments of the disclosure relate to silicon precursors, oxidants and methods for depositing silicon-containing films. More particularly, embodiments of the disclosure are directed to strained-ring silicon precursors, oxaziridine oxidants, P/S/N oxides, and methods of use thereof.

BACKGROUND

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

The advancing complexity of advanced microelectronic devices is placing stringent demands on currently used deposition techniques. Unfortunately, there is a limited number of viable chemical precursors available that have the requisite properties of robust thermal stability, high reactivity, and vapor pressure suitable for film growth to occur. In addition, precursors that often meet these requirements still suffer from poor long-term stability and lead to thin films that contain elevated concentrations of contaminants such as oxygen, nitrogen, and/or halides that are often deleterious to the target film application.

Silicon-containing films are often contaminated by halogens through the use of halogen-containing precursors. These halogen contaminants can often negatively affect device performance and require separate removal procedures, which may not be entirely effective.

Further, there is a need for lower temperature deposition processes as many substrate materials often already contain temperature sensitive materials and structures (e.g., logic devices). Also, deposition procedures without the use of plasma and/or ozone would decrease hardware demands and potentially improve selectivity.

Accordingly, there is a need in the art for novel silicon precursors and oxidants that are free of halogen, that have low activation energy requirements and/or can deposit silicon containing films without plasma.

SUMMARY

One or more embodiment of the disclosure is directed to a method of depositing a silicon-containing material. The method comprises exposing a substrate to a cyclic silicon precursor and a reactant, the cyclic silicon precursor includes a 3- or 4-membered ring containing silicon.

Additional embodiments of the disclosure are directed to a method of depositing silicon oxide. The method comprises exposing a substrate to a silicon precursor and an oxidant comprising an oxaziridine.

Further embodiments of the disclosure are directed to a method of a method of depositing silicon oxide. The method comprises exposing a substrate to a silicon precursor and an oxidant comprising a P/S/N oxide.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

Figure 1:
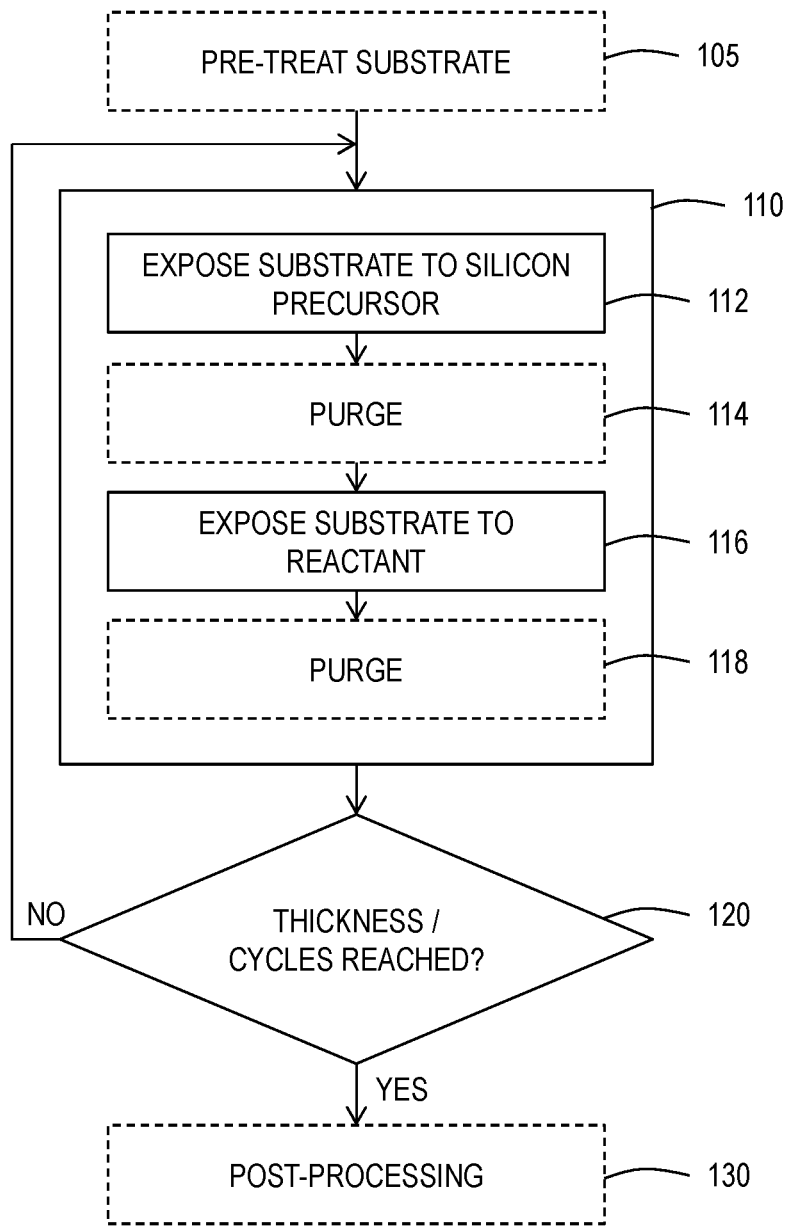
FIG. 1 illustrates a process flow diagram of a method in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

Embodiments of the disclosure provide precursors, reactants and processes for depositing silicon-containing films. Some embodiments of the disclosure provide a cyclic silicon precursor. In some embodiments, the cyclic silicon precursor is substantially free of halogens. In some embodiments, the cyclic silicon precursor includes a 3- or 4-membered ring containing silicon. In some embodiments, the cyclic silicon precursor can be used under ALD and CVD conditions to deposit silicon-containing films.

As identified above, the cyclic silicon precursor of one or more embodiments are substantially free of halogens. As used herein, the term "substantially free" means that there is less than about 5%, including less than about 4%, less than about 3%, less than about 2%, less than about 1%, and less than about 0.5% of halogen, on an atomic basis, in the cyclic silicon precursor.

Some embodiments of the disclosure provide oxidants. In some embodiments, the oxidants comprise an oxaziridine. In some embodiments, the oxidants comprise a P/S/N oxide. In some embodiments, the oxidants can be used under ALD and CVD conditions to deposit silicon-containing films.

The process of various embodiments uses vapor deposition techniques, such as an atomic layer deposition (ALD) or chemical vapor deposition (CVD) to provide silicon-containing films. The cyclic silicon precursor and/or oxidant of one or more embodiments are volatile and thermally stable, and, thus, suitable for vapor deposition. In some embodiments, the cyclic silicon precursor and/or oxidant have relatively low activation barriers for forming silicon-containing films. In some embodiments, the cyclic silicon precursor and/or oxidant can be used to form silicon-containing films at relative low temperatures. In some embodiments, the cyclic silicon precursor and/or oxidant can be used to form silicon-containing films without the use of plasma.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the molybdenum-containing layer, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the molybdenum-containing layer may be at least partially formed thereon. For example, in some embodiments, a layer comprising a metal, a nitride, an oxide, or the like, or combinations thereof may be disposed on the substrate and may have the silicon-containing layer formed upon such layer or layers.

According to one or more embodiments, the method uses an atomic layer deposition (ALD) process. In such embodiments, the substrate surface is exposed to the precursors (also referred to as reactants or reactive gases) sequentially or substantially sequentially. As used herein throughout the specification, "substantially sequentially" means that a majority of the duration of a precursor exposure does not overlap with the exposure to a co-reagent, although there may be some overlap.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate is exposed sequentially to the two or more reactive compounds which are introduced into a reaction zone of a processing chamber. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas (e.g., hydrogen radicals) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Without intending to be bound by theory, it is thought that the presence of halogens in the structure of silicon precursors can pose challenges, as halogen contamination may affect device performance and hence require additional removal procedures.

Silicon-containing films can be grown by atomic layer deposition or chemical vapor deposition for many applications. One or more embodiments of the disclosure advantageously provide processes for atomic layer deposition or chemical vapor deposition to form silicon-containing films. As used in this specification and the appended claims, the term "silicon-containing film" refers to a film that comprises silicon atoms and has greater than or equal to about 1 atomic % silicon, greater than or equal to about 2 atomic % silicon, greater than or equal to about 3 atomic % silicon, greater than or equal to about 4 atomic % silicon, greater than or equal to about 5 atomic % silicon, greater than or equal to about 10 atomic % silicon, greater than or equal to about 15 atomic % silicon, greater than or equal to about 20 atomic % silicon, greater than or equal to about 25 atomic % silicon, greater than or equal to about 30 atomic % silicon, greater than or equal to about 35 atomic % silicon, greater than or equal to about 40 atomic % silicon, greater than or equal to about 45 atomic % silicon, greater than or equal to about 50 atomic % silicon, or greater than or equal to about 60 atomic % silicon. In some embodiments, the silicon-containing film comprises one or more of elemental silicon (e.g., amorphous silicon, polycrystalline, crystalline), silicon oxide (SiO), silicon nitride (SiN), silicon carbide (SiC) or combinations thereof. The skilled artisan will recognize that the use of molecular formula like SiO does not imply a specific stoichiometric relationship between the elements but merely the identity of the major components of the film. For example, SiO refers to a film whose major composition comprises silicon and oxygen atoms. In some embodiments, the major composition of the specified film (i.e., the sum of the atomic percents of the specified atoms) is greater than or equal to about 95%, 98%, 99% or 99.5% of the film, on an atomic basis.

With reference to FIG. 1, one or more embodiments of the disclosure are directed to method 100 of depositing a film. The method illustrated in FIG. 1 is representative of an atomic layer deposition (ALD) process in which the substrate or substrate surface is exposed sequentially to the reactive gases in a manner that prevents or minimizes gas phase reactions of the reactive gases. In some embodiments, the method comprises a chemical vapor deposition (CVD) process in which the reactive gases are mixed in the processing chamber to allow gas phase reactions of the reactive gases and deposition of the thin film.

In some embodiments, the method 100 includes a pre-treatment operation 105. The pre-treatment can be any suitable pre-treatment known to the skilled artisan. Suitable pre-treatments include, but are not limited to, pre-heating, cleaning, soaking, native oxide removal, or deposition of an adhesion layer (e.g. titanium nitride (TiN)).

At deposition 110, a process is performed to deposit a silicon-containing film on the substrate (or substrate surface). The deposition process can include one or more operations to form a film on the substrate. In operation 112, the substrate (or substrate surface) is exposed to a silicon precursor to deposit a film on the substrate (or substrate surface). The silicon precursor can be any suitable silicon-containing compound that can react with (i.e., adsorb or chemisorb onto) the substrate surface to leave a silicon-containing species on the substrate surface.

In some embodiments, the silicon precursor comprises silane, a polysilane, or a cyclosilane and may comprise one or more halogen atoms. In some embodiments, the silicon precursor comprises one or more of silane, disilane, trisilane, tetrasilane, cyclopentasilane, cyclohexasilane, chlorosilane, dichlorosilane, or hexachlorodisilane.

Unless otherwise indicated, the term "lower alkyl," "alkyl," or "alk" as used herein alone or as part of another group includes both straight and branched chain hydrocarbons, containing 1 to 20 carbons, 1 to 10 carbons, 1 to 8 carbons, 1 to 6 carbons, 1 to 4 carbons or 1 to 2 carbons in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. The alkyl may be substituted or unsubstituted.

In one or more embodiments, the cyclic silicon precursor includes a 3- or 4-membered ring containing silicon. In some embodiments, the cyclic silicon precursor has a general formula of:

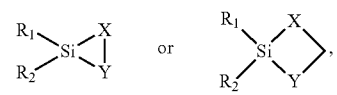

where X and Y are independently selected from $CH_2$, $SiH_2$, NH, S, or Se and $R_1$ and $R_2$ are each independently H or alkyl. In some embodiments, at least one or both of X or Y is S. In some embodiments, $R_1$ and $R_2$ are each independently C1-C8 alkyl, C1-C6 alkyl, C1-4 alkyl, C1-C2 alkyl or join together to form a C3-C8 cycloalkyl.

In some embodiments, the cyclic silicon precursor has a general formula of:

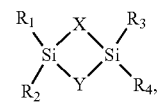

where X and Y are independently selected from $CH_2$, $SiH_2$, NH, S, or Se and $R_1$-$R_4$ are each independently H or alkyl. In some embodiments, $R_1$-$R_4$ are each independently C1-C8 alkyl, C1-C6 alkyl, C1-4 alkyl, or C1-C2 alkyl. In some embodiments, the cyclic silicon precursor comprises:

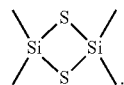

Figure 2:
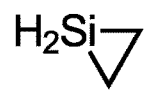
FIG. 2 illustrates exemplary silicon precursors in accordance with one or more embodiment of the disclosure.
Figure 2:
Figure 2:
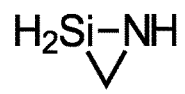
Figure 2:
Figure 2:
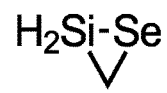
Figure 2:
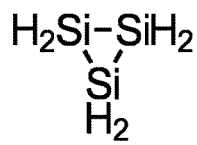
Figure 2:
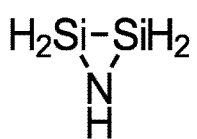
Figure 2:
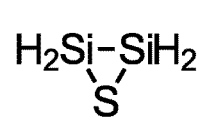
Figure 2:
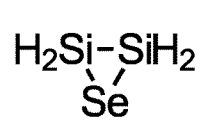
Figure 2:
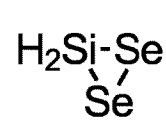
Figure 2:
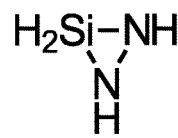
Figure 2:
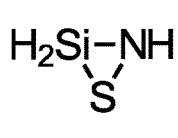
Figure 2:
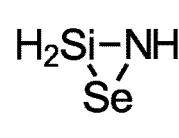
Figure 2:
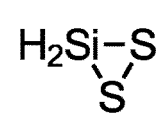
Figure 2:
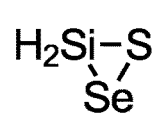
Figure 2:
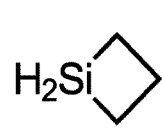
Figure 2:
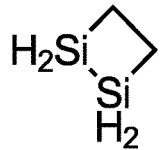
Figure 2:
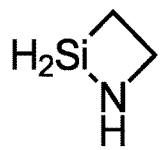
Figure 2:
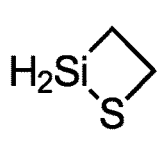
Figure 2:
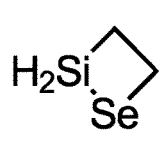
Figure 2:
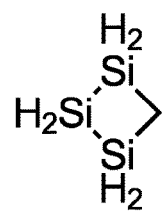
Figure 2:
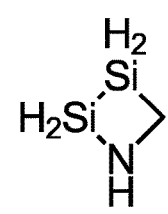
Figure 2:
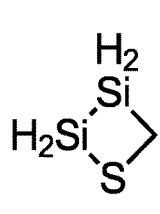
Figure 2:
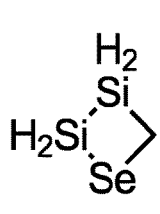
Figure 2:
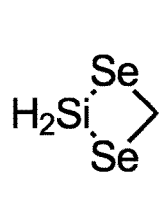
Figure 2:
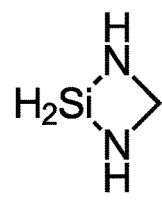
Figure 2:
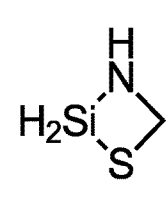
Figure 2:
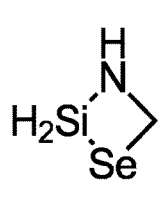
Figure 2:
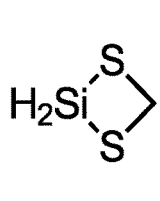
Figure 2:
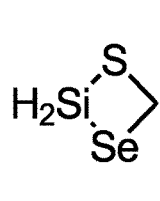

FIG. 2 illustrates a non-limiting collection of exemplary cyclic silicon precursors.

Without being bound by theory, it is believed that the cyclic silicon precursors disclosed herein react by a thermodynamically favorable ring opening mechanism. In some embodiments, the ring opening reaction of the cyclic silicon precursor has a more negative reaction energy than silicon halide bonds.

At operation 114, the processing chamber is optionally purged to remove unreacted silicon precursor, reaction products and by-products. As used in this manner, the term "processing chamber" also includes portions of a processing chamber adjacent the substrate surface without encompassing the complete interior volume of the processing chamber.

For example, in a sector of a spatially separated processing chamber, the portion of the processing chamber adjacent the substrate surface is purged of the molybdenum precursor by any suitable technique including, but not limited to, moving the substrate through a gas curtain to a portion or sector of the processing chamber that contains none or substantially none of the silicon precursor. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of nitrogen ($N_2$), helium (He), and argon (Ar).

At operation 116, the substrate (or substrate surface) is exposed to a reactant to form a silicon-containing film on the substrate. The reactant can react with the silicon-containing species on the substrate surface to form the silicon-containing film. In some embodiments, the reactant comprises a reducing agent. In one or more embodiments, the reducing agent can comprise any reducing agent known of to one of skill in the art. In other embodiments, the reactant comprises an oxidizing agent. In one or more embodiments, the oxidizing agent can comprise any oxidizing agent known to one of skill in the art. In further embodiments, the reactant comprises one or more oxidizing agent and a reducing agent.

In specific embodiments, the reactant is selected from one or more of 1,1-dimethylhydrazine (DMH), alkyl amine, hydrazine, alkyl hydrazine, allyl hydrazine, hydrogen ($H_2$), ammonia ($NH_3$), alcohols, water ($H_2O$), oxygen ($O_2$), ozone ($O_3$), nitrous oxide ($N_2O$), nitrogen dioxide ($NO_2$), peroxides, and plasmas thereof. In some embodiments, the alkyl amine is selected from one or more of tert-butyl amine (tBuNH$_2$), isopropyl amine (iPrNH$_2$), ethylamine (CH$_3$CH$_2$NH$_2$), diethylamine ((CH$_3$CH$_2$)$_2$NH), or butyl amine (BuNH$_2$). In some embodiments, the reactant comprises one or more of compounds with the formula R'NH$_2$, R'$_2$NH, R'$_3$N, R'$_2$SiNH$_2$, (R'$_3$Si)$_2$NH, (R'$_3$Si)$_3$N; where each R' is independently H or an alkyl group having 1-12 carbon atoms. In some embodiments, the alkyl amine consists essentially of one or more of tert-butyl amine (tBuNH$_2$), isopropyl amine (iPrNH$_2$), ethylamine (CH$_3$CH$_2$NH$_2$), diethylamine ((CH$_3$CH$_2$)$_2$NH), butyl amine (BuNH$_2$).

Figure 3:
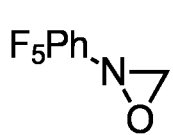
FIG. 3 illustrates exemplary oxaziridines in accordance with one or more embodiment of the disclosure.
Figure 3:
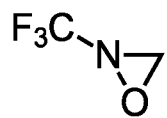
Figure 3:
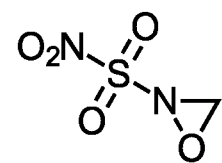
Figure 3:
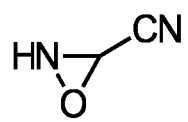
Figure 3:
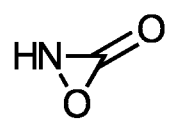
Figure 3:
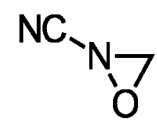
Figure 3:
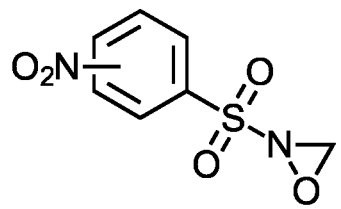
Figure 3:
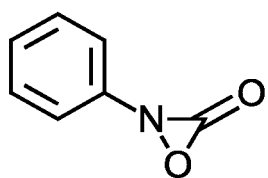
Figure 3:
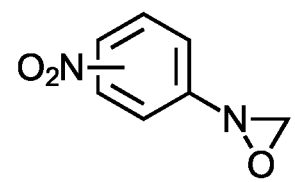
Figure 3:
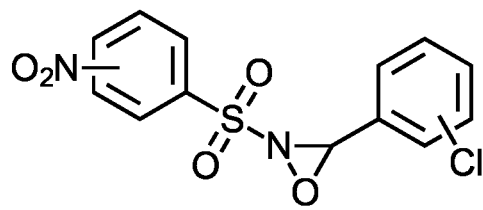
Figure 3:
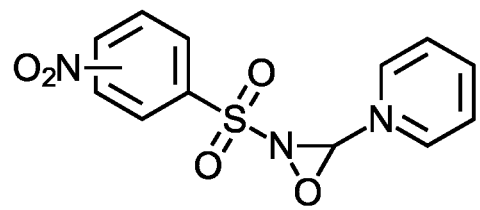
Figure 3:
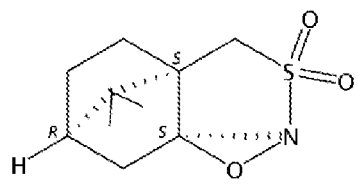
Figure 3:
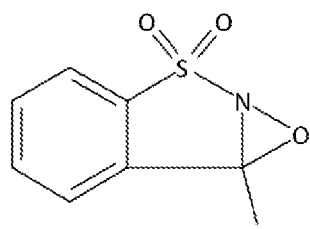

In some embodiments, the oxidant comprises an oxaziridine. In some embodiments, the oxaziridine comprises a compound with the general formula:

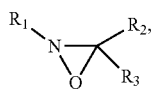

where R$_1$, R$_2$ and R$_3$ are independently selected from H, SO$_2$NO$_2$, CN, C1-C8 alkyl, C1-C8 perfluoroalkyl, pyridine, aryl, substituted aryl, perfluoroaryl, SO$_2$—NO$_2$ substituted aryl, or R$_2$ and R$_3$ are combined to form a carbonyl. In some embodiments, R$_1$, R$_2$ and R$_3$ are independently selected from C1-C6 alkyl, C1-C6 perfluoroalkyl, C1-C4 alkyl, or C1-C6 perfluoroalkyl. FIG. 3 illustrates a non-limiting collection of exemplary oxaziridines.

In some embodiments, when R$_2$ and R$_3$ are H, R$_1$ is an electron withdrawing group. In some embodiments, the electron withdrawing group is —CN or —SO$_2$NO$_2$.

In specific embodiments, the oxaziridine comprises one or more of:

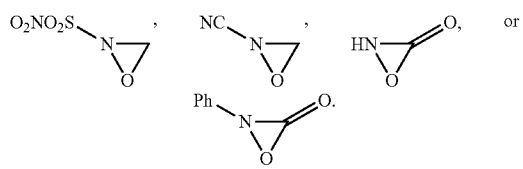

In some embodiments, the oxaziridine is bicyclic. In some embodiments, the oxaziridine comprises one or more of:

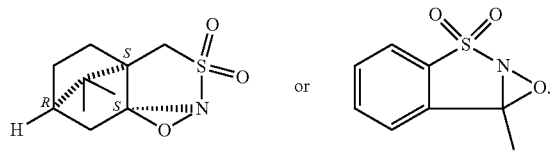

Figure 4:
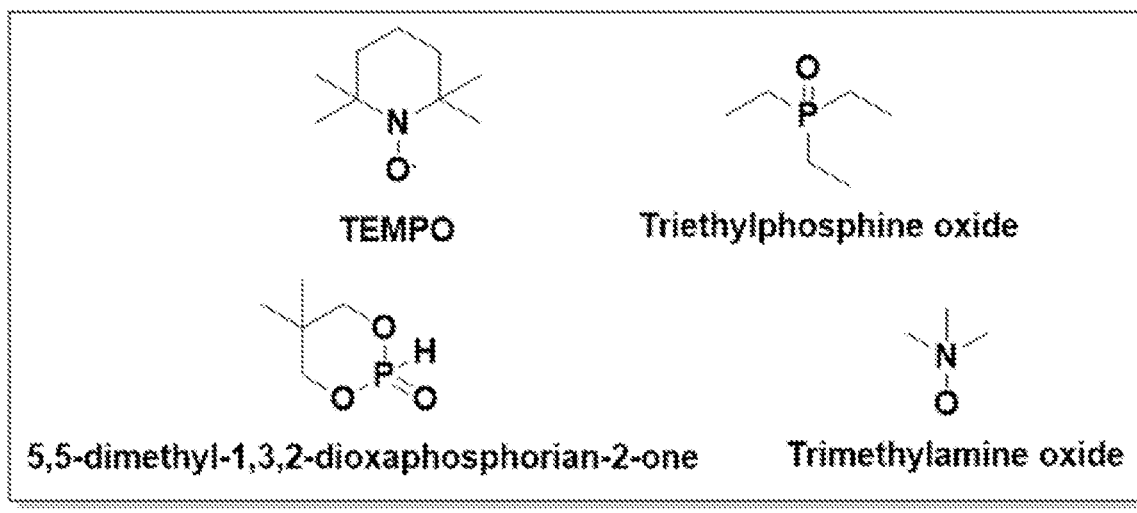
FIG. 4 illustrates exemplary P/S/N oxides in accordance with one or more embodiment of the disclosure.
Figure 4:
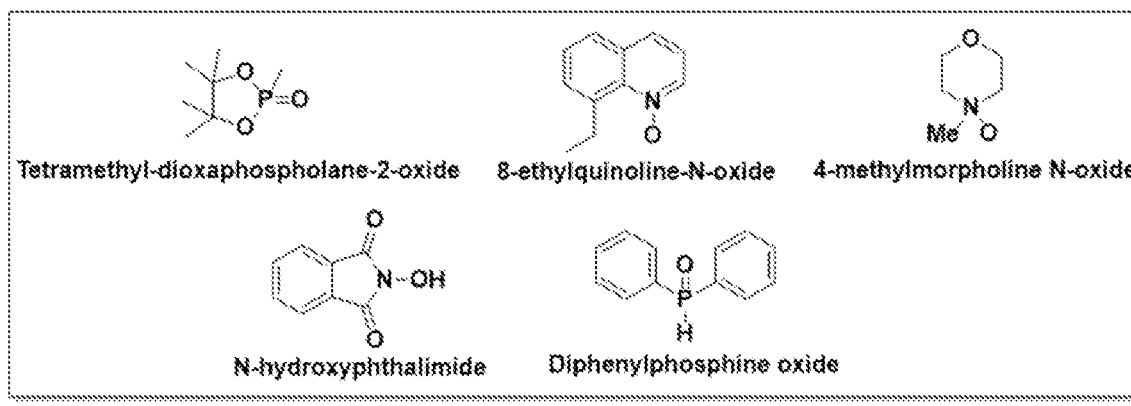

In some embodiments, the oxidant comprises a P/S/N oxide. As used in this regard, a "P/S/N oxide" refers to the genus of oxides comprising P-oxides, S-oxides and N-oxides. In some embodiments, the P/S/N oxide comprises a compound with the general formula:

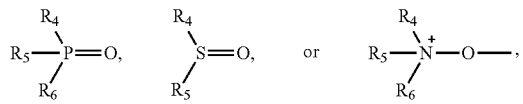

where R$_4$, R$_5$ and R$_6$ are independently selected from H, C1-C8 alkyl, or aryl, and R$_4$ and R$_5$ may join to form a three to six membered ring including at least one P, S or N heteroatom. In some embodiments, R$_4$, R$_5$ and R$_6$ are independently selected from C1-C6 alkyl, or C1-C4 alkyl. FIG. 4 illustrates a non-limiting collection of exemplary P/S/N oxides.

In some embodiments, the P/S/N oxides comprises a P-oxide. In some embodiments, the P-oxide comprises one or more of H$_3$PO, (CH$_3$)$_3$PO, (C$_2$H$_5$)$_3$PO, MPPO (3-methyl-1-phenyl-2-pholene 1-oxide), 3-methyl-1-phenyl-3-phospholene 1-oxide, neopentylene phosphite (5,5-Dimethyl-1,3,2-dioxaphosphinane 2-oxide), HASPO-1 (4,4,5,5-Tetramethyl-1,3,2-dioxaphospholane 2-oxide), 2-Methyl-4,4,5,5-tetramethyl-1,3,2-dioxaphospholan-2-one, or diphenylphosphine oxide.

In some embodiments, the P/S/N oxide comprises a S-oxide. In some embodiments, the S-oxide comprises one or more of H$_2$SO, or MPSO (methyl phenyl sulfoxide).

In some embodiments, the P/S/N oxide comprises an N-oxide. In some embodiments, the N-oxide comprises one or more of H$_3$N→O, trimethylamine n-oxide, pyridine-n-oxide, TEMPO ((2,2,6,6-Tetramethylpiperidin-1-yl)oxyl), N-hydroxyphthalimide, or 4-methylmorpholine n-oxide.

At operation 118, the processing chamber is optionally purged after exposure to the reactant. Purging the processing chamber in operation 118 can be the same process or different process than the purge in operation 114. Purging the processing chamber, portion of the processing chamber, area adjacent the substrate surface, etc., removes unreacted reactant, reaction products and by-products from the area adjacent the substrate surface.

At decision 120, the thickness of the deposited film, or number of cycles of silicon precursor and reactant is considered. If the deposited film has reached a predetermined thickness or a predetermined number of process cycles have been performed, the method 100 moves to an optional post-processing operation 130. If the thickness of the deposited film or the number of process cycles has not reached the predetermined threshold, the method 100 returns to operation 110 to expose the substrate surface to the molybdenum precursor again in operation 112, and continuing.

The optional post-processing operation 130 can be, for example, a process to modify film properties (e.g., annealing) or a further film deposition process (e.g., additional ALD or CVD processes) to grow additional films. In some embodiments, the optional post-processing operation 130 can be a process that modifies a property of the deposited film. In some embodiments, the optional post-processing operation 130 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film. In one or more embodiments, annealing can also with performed with a gas under plasma. In one or more embodiments, the annealing temperature may be lower with plasma.

In one or more embodiments, the plasma comprises one or more of nitrogen ($N_2$), argon (Ar), helium (He), hydrogen ($H_2$), carbon monoxide (CO), carbon dioxide ($CO_2$) methane ($CH_4$), and ammonia ($NH_3$). In some embodiments, the plasma is a remote plasma. In other embodiments, the plasma is a direct plasma.

In one or more embodiments, the plasma may be generated remotely or within the processing chamber. In one or more embodiments, the plasma is an inductively coupled plasma (ICP) or a conductively coupled plasma (CCP). Any suitable power can be used depending on, for example, the reactants, or the other process conditions. In some embodiments, the plasma is generated with a plasma power in the range of about 10 W to about 3000 W. In some embodiments, the plasma is generated with a plasma power less than or equal to about 3000 W, less than or equal to about 2000 W, less than or equal to about 1000 W, less than or equal to about 500 W, or less than or equal to about 250 W.

The method 100 can be performed at any suitable temperature depending on, for example, the silicon precursor, reactant or thermal budget of the device. In one or more embodiments, the use of high temperature processing may be undesirable for temperature-sensitive substrates, such as logic devices. In some embodiments, exposure to the silicon precursor (operation 112) and the reactant (operation 116) occur at the same temperature. In some embodiments, substrate is maintained at a temperature in a range of about 20° C. to about 400° C., or about 50° C. to about 500° C.

In some embodiments, exposure to the silicon precursor (operation 112) occurs at a different temperature than the exposure to the reactant (operation 116). In some embodiments, the substrate is maintained at a first temperature in a range of about 20° C. to about 400° C., or about 50° C. to about 500° C., for the exposure to the silicon precursor, and at a second temperature in the range of about 20° C. to about 400° C., or about 50° C. to about 500° C., for exposure the reactant.

In the embodiment illustrated in FIG. 1, at deposition operation 110 the substrate (or substrate surface) is exposed to the silicon precursor and the reactant sequentially. In another, un-illustrated, embodiment, the substrate (or substrate surface) is exposed to the silicon precursor and the reactant simultaneously in a CVD reaction. In a CVD reaction, the substrate (or substrate surface) can be exposed to a gaseous mixture of the silicon precursor and reactant to deposit a silicon-containing film having a predetermined thickness. In the CVD reaction, the silicon-containing film can be deposited in one exposure to the mixed reactive gas, or can be multiple exposures to the mixed reactive gas with purges between.

In some embodiments, the silicon-containing film formed comprises elemental silicon. In some embodiments, the film consists essentially of silicon. As used in this manner, the term "consists essentially of silicon" means that the silicon-containing film is greater than or equal to about 80%, 85%, 90%, 95%, 98%, 99% or 99.5% silicon, on an atomic basis. Measurements of the composition of the silicon-containing film refer to the bulk portion of the film, excluding interface regions where diffusion of elements from adjacent films may occur.

In other embodiments, the silicon-containing film comprises silicon oxide ($SiO_x$) with an oxygen content of greater than or equal to about 5%, 7.5%, 10%, 12.5 or 15%, on an atomic basis. In some embodiments, the silicon-containing film comprises an oxygen content in the range of about 1% to about 50%, or about 2% to about 40%, or about 3% to about 30%, or in the range of about 4% to about 25%, or in the range of about 5% to about 20%, on an atomic basis.

In other embodiments, the silicon-containing film comprises silicon nitride ($SiN_x$) with a nitrogen content of greater than or equal to about 5%, 7.5%, 10%, 12.5 or 15%, on an atomic basis. In some embodiments, the silicon-containing film comprises a nitrogen content in the range of about 1% to about 40%, or about 2% to about 30%, or in the range of about 3% to about 25%, or in the range of about 4% to about 20%, on an atomic basis.

In other embodiments, the silicon-containing film comprises silicon carbide ($SiC_x$) with a carbon content of greater than or equal to about 5%, 7.5%, 10%, 12.5 or 15%, on an atomic basis. In some embodiments, the silicon-containing film comprises a carbon content in the range of about 2% to about 30%, or in the range of about 3% to about 25%, or in the range of about 4% to about 20%, on an atomic basis.

The deposition operation 110 can be repeated to form one or more of a silicon film, a silicon oxide film, a silicon nitride film, a silicon carbide film, or a combination thereof, having a predetermined thickness. In some embodiments, the deposition operation 110 is repeated to provide one or more of a silicon film, a silicon oxide film, a silicon nitride film, a silicon carbide film, or a combination thereof, having a thickness in the range of about 0.3 nm to about 100 nm, or in the range of about 30 Å to about 3000 Å.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a silicon-containing material on a semiconductor substrate, the method comprising exposing the semiconductor substrate to a cyclic silicon precursor and a reactant, the cyclic silicon precursor includes a 3- or 4-membered ring containing silicon, wherein the cyclic silicon precursor has a general formula of:

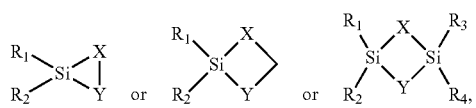

where X and Y are independently selected from SiH2, NH, S, or Se, wherein at least one of X or Y is S, and R1, R2, R3, and R4 are independently selected from an alkyl group.

2. The method of claim 1, wherein the silicon-containing material comprises silicon nitride and the reactant is selected from the group consisting of hydrazine, alkyl hydrazine, allyl hydrazine, hydrogen (H2), ammonia ($NH_3$), $R'NH_2$, $R'_2NH$, $R'_3N$, $R'_2SINH_2$, $(R'sSi)_2NH$, and $(R'_3Si)_3N$, where each R' is independently H or an alkyl group having 1-12 carbon atoms.

3. The method of claim 1, wherein the silicon-containing material comprises silicon nitride comprising a nitrogen containing content in a range of from 1% to 40% on an atomic basis.

4. The method of claim 1, wherein the cyclic silicon precursor comprises

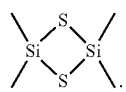

5. The method of claim 1, wherein the silicon-containing material comprises silicon oxide, and the reactant is selected from the group consisting of an oxaziridine and a P/S/N oxide.

6. The method of claim 5, wherein the reactant is an oxaziridine.

7. The method of claim 6, wherein the silicon oxide film comprises greater than 98 atomic % of silicon and oxygen atoms.

8. The method of claim 6, wherein the oxaziridine comprises a compound with a general formula of:

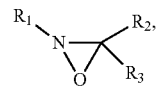

where $R_1$, $R_2$ and $R_3$ are independently selected from H, $SO_2NO_2$, CN, C1-C8 alkyl, C1-C8 perfluoroalkyl, pyridine, aryl, substituted aryl, perfluoroaryl, $SO_2$-$NO_2$ substituted aryl, or $R_2$ and $R_3$ are combined to form a carbonyl.

9. The method of claim 6, wherein the oxaziridine comprises one or more of:

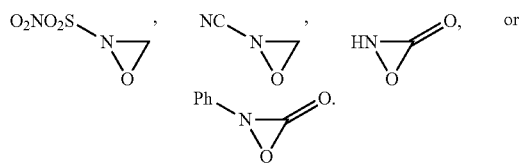

10. The method of claim 6, wherein the oxaziridine is bicyclic.

11. The method of claim 10, wherein the oxaziridine comprises one or more of:

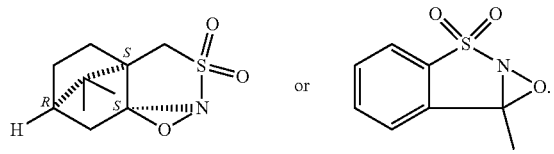

12. The method of claim 5, wherein the P/S/N oxide comprises a compound with a general formula of:

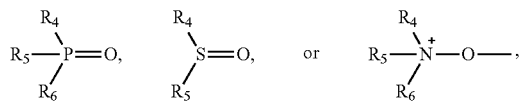

where $R_4$, $R_5$ and $R_6$ are independently selected from H, alkyl, or aryl, and $R_4$ and $R_5$ may join to form a three to six membered ring including at least one P, S or N heteroatom.

13. The method of claim 12, wherein

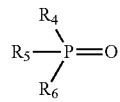

comprises one or more of $H_3PO$, $(CH_3)_3PO$, $(C_2H_5)_3PO$, MPPO (3-methyl-1-phenyl-2-phospholene 1-oxide), 3-methyl-1-phenyl-2-phospholene 1-oxide, neopentylene phosphite (5,5-Dimethyl-1,3,2-dioxaphosphinane 2-oxide), HASPO-1 (4,4,5,5-Tetramethyl-1,3,2-dioxaphospholane 2-oxide), 2-Methyl-4,4,5,5-tetramethyl-1,3,2-dioxaphospholan-2-one, or diphenylphosphine oxide.

14. The method of claim 12, wherein

comprises one or more of H$_2$SO, or MPSO (methyl phenyl sulfoxide).

15. The method of claim 12, wherein

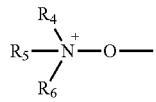

comprises one or more of H$_3$N→O, trimethylamine n-oxide, pyridine-n-oxide, TEMPO ((2,2,6,6-Tetramethylpiperidin-1-yl)oxyl), N-hydroxyphthalimide, or 4-methylmorpholine n-oxide.

16. A method of depositing a silicon-containing material on a semiconductor substrate, the method comprising exposing the semiconductor substrate to a cyclic silicon precursor and a reactant, the cyclic silicon precursor includes a 3- or 4-membered ring containing silicon,
wherein the cyclic silicon precursor has a general formula of:

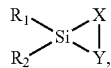

where X and Y are independently selected from SiH$_2$, NH, S, or Se, and R$_1$, R$_2$, R$_3$, and R$_4$ are independently selected from an alkyl group, and wherein the silicon-containing material comprises silicon oxide, and the reactant is a P/S/N oxide.

17. The method of claim 16, wherein X is S and Y is NH.

18. The method of claim 17, wherein the P/S/N oxide comprises a compound with a general formula of:

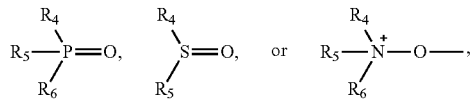

where R$_4$, R$_5$ and R$_6$ are independently selected from H, alkyl, or aryl, and R$_4$ and R$_5$ may join to form a three to six membered ring including at least one P, S or N heteroatom.

19. The method of claim 18, wherein

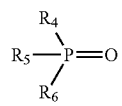

comprises one or more of H$_3$PO, (CH$_3$)$_3$PO, (C$_2$H$_5$)$_3$PO, MPPO (3-methyl-1-phenyl-2-phospholene 1-oxide), 3-methyl-1-phenyl-2-phospholene 1-oxide, neopentylene phosphite (5,5-Dimethyl-1,3,2-dioxaphosphinane 2-oxide), HASPO-1 (4,4,5,5-Tetramethyl-1,3,2-dioxaphospholane 2-oxide), 2-Methyl-4,4,5,5-tetramethyl-1,3,2-dioxaphospholan-2-one, or diphenylphosphine oxide, wherein

comprises one or more of H$_2$SO, or MPSO (methyl phenyl sulfoxide), and wherein

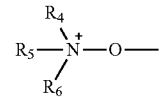

comprises one or more of H$_3$N→O, trimethylamine n-oxide, pyridine-n-oxide, TEMPO ((2,2,6,6-Tetramethylpiperidin-1-yl)oxyl), N-hydroxyphthalimide, or 4-methylmorpholine n-oxide.

* * * * *